United States Patent
Werkhoven et al.

(10) Patent No.: US 9,142,412 B2
(45) Date of Patent: *Sep. 22, 2015

(54) SEMICONDUCTOR DEVICES INCLUDING SUBSTRATE LAYERS AND OVERLYING SEMICONDUCTOR LAYERS HAVING CLOSELY MATCHING COEFFICIENTS OF THERMAL EXPANSION, AND RELATED METHODS

(75) Inventors: Christiaan J. Werkhoven, Gilbert, AZ (US); Chantal Arena, Mesa, AZ (US)

(73) Assignee: SOITEC, Bernin (FR)

( * ) Notice: Subject to any disclaimer, the term of this patent is extended or adjusted under 35 U.S.C. 154(b) by 71 days.

This patent is subject to a terminal disclaimer.

(21) Appl. No.: 13/336,883

(22) Filed: Dec. 23, 2011

(65) Prior Publication Data

US 2013/0161637 A1    Jun. 27, 2013

(51) Int. Cl.
*H01L 21/20* (2006.01)
(52) U.S. Cl.
CPC .................... *H01L 21/2007* (2013.01)
(58) Field of Classification Search
CPC .................................................. H01L 21/2007
USPC .................. 438/46, 455, 458, 580, 795, 796; 257/E21.152, E21.097, 76
See application file for complete search history.

(56) References Cited

U.S. PATENT DOCUMENTS

| | | | |
|---|---|---|---|
| 6,010,579 A | 1/2000 | Henley et al. | |
| 6,194,742 B1 | 2/2001 | Kern et al. | |
| 6,303,468 B1 | 10/2001 | Aspar et al. | |
| 6,328,796 B1 | 12/2001 | Kub et al. | |
| 6,335,258 B1 | 1/2002 | Aspar et al. | |
| 6,411,393 B1 | 6/2002 | Wakasugi | |
| 6,756,286 B1 | 6/2004 | Moriceau et al. | |
| 6,794,276 B2 | 9/2004 | Letertre et al. | |
| 6,809,044 B1 | 10/2004 | Aspar et al. | |
| 6,815,309 B2 | 11/2004 | Letertre et al. | |
| 6,858,107 B2 | 2/2005 | Ghyselen et al. | |
| 6,867,067 B2 | 3/2005 | Ghyselen et al. | |
| 6,908,828 B2 | 6/2005 | Letertre et al. | |
| 6,946,365 B2 | 9/2005 | Aspar et al. | |
| 6,964,914 B2 | 11/2005 | Ghyselen et al. | |

(Continued)

FOREIGN PATENT DOCUMENTS

AT    514180 T    7/2011
AT    534759 T    12/2011

(Continued)

OTHER PUBLICATIONS

Davis (Ed.). (2004). Handbook of thermal spray technology (pp. 3-13). Materials Park, OH: ASM International.*

(Continued)

*Primary Examiner* — Zandra Smith
*Assistant Examiner* — Lauren R Bell
(74) *Attorney, Agent, or Firm* — TraskBritt (57) ABSTRACT

Embodiments relate to semiconductor structures and methods of forming semiconductor structures. The semiconductor structures include a substrate layer having a CTE that closely matches a CTE of one or more layers of semiconductor material formed over the substrate layer. In some embodiments, the substrate layers may comprise a composite substrate material including two or more elements. The substrate layers may comprise a metal material and/or a ceramic material in some embodiments.

27 Claims, 5 Drawing Sheets

(56) References Cited

U.S. PATENT DOCUMENTS

| | | | |
|---|---|---|---|
| 7,071,029 | B2 | 7/2006 | Ghyselen et al. |
| RE39,484 | E | 2/2007 | Bruel |
| 7,226,509 | B2 | 6/2007 | Faure |
| 7,261,777 | B2 | 8/2007 | Faure |
| 7,262,466 | B2 | 8/2007 | Aitken et al. |
| 7,271,416 | B2 | 9/2007 | Saxler |
| 7,288,430 | B2 | 10/2007 | Faure et al. |
| 7,387,677 | B2 | 6/2008 | Dwilinski et al. |
| 7,387,947 | B2 | 6/2008 | Cayrefourcq et al. |
| 7,407,869 | B2 | 8/2008 | Ghyselen et al. |
| 7,422,957 | B2 | 9/2008 | Ghyselen |
| 7,465,991 | B2 | 12/2008 | Ghyselen |
| 7,531,428 | B2 | 5/2009 | Dupont |
| 7,622,330 | B2 | 11/2009 | Ghyselen et al. |
| 7,635,635 | B2 | 12/2009 | Yilmaz et al. |
| 7,655,537 | B2 | 2/2010 | Ghyselen et al. |
| 7,732,301 | B1 * | 6/2010 | Pinnington et al. ............ 438/455 |
| 7,741,678 | B2 | 6/2010 | Ghyselen et al. |
| 7,888,235 | B2 | 2/2011 | Letertre et al. |
| 8,101,451 | B1 | 1/2012 | Murali et al. |
| 8,101,498 | B2 | 1/2012 | Pinnington et al. |
| 8,436,363 | B2 * | 5/2013 | Werkhoven et al. ............ 257/76 |
| 2002/0017696 | A1 | 2/2002 | Nakayama et al. |
| 2003/0064535 | A1 | 4/2003 | Kub et al. |
| 2003/0219959 | A1 | 11/2003 | Ghyselen et al. |
| 2004/0224469 | A1 | 11/2004 | Lim et al. |
| 2006/0099776 | A1 | 5/2006 | Dupont |
| 2006/0118513 | A1 | 6/2006 | Faure et al. |
| 2006/0255341 | A1 | 11/2006 | Pinnington et al. |
| 2007/0072324 | A1 | 3/2007 | Krames et al. |
| 2007/0231963 | A1 | 10/2007 | Doan et al. |
| 2008/0296584 | A1 | 12/2008 | Hachigo |
| 2009/0278233 | A1 | 11/2009 | Pinnington et al. |
| 2011/0057165 | A1 | 3/2011 | Pinnington |
| 2011/0117726 | A1 | 5/2011 | Pinnington et al. |
| 2011/0127581 | A1 | 6/2011 | Bethoux et al. |
| 2011/0136281 | A1 | 6/2011 | Sheen |
| 2011/0233784 | A1 | 9/2011 | Moosburger et al. |
| 2012/0122301 | A1 * | 5/2012 | Fujiwara et al. ............ 438/478 |
| 2012/0199845 | A1 | 8/2012 | Werkhoven et al. |
| 2012/0309269 | A1 * | 12/2012 | Khayyat et al. ................. 451/41 |

FOREIGN PATENT DOCUMENTS

| | | |
|---|---|---|
| AU | 3213100 A | 8/2000 |
| AU | 2203702 A | 6/2002 |
| CN | 100343424 C | 10/2007 |
| CN | 101273472 A | 9/2008 |
| CN | 100442439 C | 12/2008 |
| CN | 101432846 A | 5/2009 |
| DE | 112007000825 T5 | 4/2009 |
| DE | 102009007625 A1 | 5/2010 |
| EP | 1338030 A2 | 8/2003 |
| EP | 1468128 A2 | 10/2004 |
| EP | 1932186 A1 | 6/2008 |
| FR | 2755537 A1 | 5/1998 |
| FR | 2817395 A1 | 5/2002 |
| FR | 2835096 A1 | 7/2003 |
| FR | 2953328 A1 | 6/2011 |
| JP | 2004519093 A | 6/2004 |
| JP | 2005515150 T | 5/2005 |
| JP | 2007096331 A | 4/2007 |
| JP | 2008053685 A | 3/2008 |
| JP | 2008538658 T | 10/2008 |
| JP | 2008300562 A | 12/2008 |
| JP | 2009514198 A | 4/2009 |
| JP | 2009532913 A | 9/2009 |
| JP | 2010529680 A | 8/2010 |
| JP | 2010272685 A | 12/2010 |
| TW | 554452 B | 9/2003 |
| TW | I259221 B | 8/2006 |
| WO | 0044966 A1 | 8/2000 |
| WO | 0243124 A2 | 5/2002 |
| WO | 03062507 A2 | 7/2003 |
| WO | 2006116030 A2 | 11/2006 |
| WO | 2007036865 A1 | 4/2007 |
| WO | 2007117829 A2 | 10/2007 |
| WO | 2009137604 A2 | 11/2009 |
| WO | 2010011842 A2 | 1/2010 |
| WO | 2011031907 A1 | 3/2011 |
| WO | 2011067276 A1 | 6/2011 |
| WO | 2011071922 A1 | 6/2011 |

OTHER PUBLICATIONS

French Search Report and Written Opinion for French Application No. FR1250386 dated Sep. 24, 2012, 7 pages.
3M Fluorinert™ Electronic Liquid FC-77, http://www.parallax-tech.com/images/phys77.pdf, visited Dec. 8, 2011, 4 pages.
ER3T, Technical Specification, Performance and Applications of the TWR 3000 Advanced System, http://www.r3t.de/documents/TWR_3000_advanced_technical_specification_V1_c.pdf, visited Dec. 8, 2011, 4 pages.
Fluorinert, http://en.wikipedia.org/wiki/FC-77, visited Dec. 8, 2011, 3 pages.
Lindow, U.S. Appl. No. 13/336,829 entitled, Methods of Growing III-V Semiconductor Materials, and Related Systems, filed Dec. 23, 2011.
Stolbov et al., First Principles Study of Adsorption, Diffusion and Dissociation of NH3 on Ni and Pd Surfaces, Department of Physics, Cardwell Hall, Kansas State University, (Manhattan, Kansas 55606, U.S.A. (arXiv:cond mat/0501060v1, submitted Jan. 5, 2005).
Werkhoven et al., U.S. Appl. No. 13/020,288 entitled, Metallic Carrier for Layer Transfer and Methods for Forming the Same, filed Feb. 3, 2011.
Werkhoven et al., U.S. Appl. No. 13/336,853 entitled, Methods of Fabricating Semiconductor Structures Using Thermal Spray Processes, and Semiconductor Structures Fabricated Using Such methods, filed Dec. 23, 2011.
Singapore Search Report and Written Opinion for Singapore Application No. 201200036-0 dated Sep. 7, 2012, 13 pages.
French Written Opinion for French Application No. FR1151664 dated Oct. 27, 2011, 5 pages.
French Preliminary Search Report for French Application No. FR1151664 dated Oct. 27, 2011, 2 pages.
Japanese Office Action for Japanese Application No. JP2011-286601 dated Nov. 12, 2013, 7 pages.
Kaplan et al. The Deposition of of Molybdenum and Tungsten Films from Vapor Decomposition of Carbonyls. J. Electrochem. Soc. (1970) vol. 117, No. 5, pp. 693-700.
Web Elements: the periodic table on the web: Molybdenum. Retrieved Aug. 15, 2013, from http://www.webelements.com/molybdenum/physics.html, 4 pages.

* cited by examiner

SEMICONDUCTOR DEVICES INCLUDING SUBSTRATE LAYERS AND OVERLYING SEMICONDUCTOR LAYERS HAVING CLOSELY MATCHING COEFFICIENTS OF THERMAL EXPANSION, AND RELATED METHODS

CROSS-REFERENCE TO RELATED APPLICATIONS

The subject matter of this application is related to the subject matter of U.S. patent application Ser. No. 13/020,288, filed Feb. 3, 2011, now U.S. Pat. No. 8,436,363, issued May 7, 2013, in the name of Werkhoven et al., which is hereby incorporated herein in its entirety by this reference. The present application is also related to U.S. patent application Ser. No. 13/336,853, filed on even date herewith and entitled "Methods Of Fabricating Semiconductor Structures Using Thermal Spray Processes, And Semiconductor Structures Fabricated Using Such Methods," which application is also hereby incorporated herein in its entirety by this reference.

FIELD

The present disclosure generally relates to the fabrication of engineered substrates for use in the fabrication of semiconductor structures or devices, intermediate structures formed during the fabrication of semiconductor structures or devices, and to semiconductor structures or devices using engineered substrates.

BACKGROUND

Substrates that include one or more layers of semiconductor material are used to form a wide variety of semiconductor structures and devices including, for example, integrated circuit (IC) devices (e.g., logic processors and memory devices) and discrete devices such as, radiation emitting devices (e.g., light emitting diodes (LEDs), resonant cavity light emitting diodes (RCLEDs), vertical cavity surface emitting lasers (VCSELs)), and radiation sensing devices (e.g., optical sensors). Such semiconductor devices are conventionally formed in a layer-by-layer manner (i.e., lithographically) on and/or in a surface of a semiconductor substrate.

Historically, a majority of such semiconductor substrates that have been used in the semiconductor device manufacturing industry have comprised thin discs or "wafers" of silicon material. Such wafers of silicon material are fabricated by first forming a large generally cylindrical silicon single crystal ingot and subsequently slicing the single crystal ingot perpendicularly to its longitudinal axis to form a plurality of silicon wafers. Such silicon wafers may have diameters as large as about thirty centimeters (30 cm) or more (about twelve inches (12 in) or more). Although silicon wafers generally have thicknesses of several hundred microns (e.g., about 700 microns) or more, only a very thin layer (e.g., less than about three hundred nanometers (300 nm)) of the semiconductor material on a major surface of the silicon wafer is generally used to form active devices. However, in some device applications, the majority of the silicon wafer thickness may be included in the electrical path-way of one or more device structures formed from the silicon wafer, such device structures being commonly referred to as "vertical" device structures.

So-called "engineered substrates" have been developed that include a relatively thin layer of semiconductor material (e.g., a layer having a thickness of less than about three hundred nanometers (300 nm)) disposed on a layer of dielectric material (e.g., silicon dioxide ($SiO_2$), silicon nitride ($Si_3N_4$), or aluminum oxide ($Al_2O_3$)). Optionally, the layer of dielectric material may be relatively thin (e.g., too thin to enable handling by conventional semiconductor device manufacturing equipment), and the semiconductor material and the layer of dielectric material may be disposed on a relatively thicker host or base substrate to facilitate handling of the overall engineered substrate by manufacturing equipment. As a result, the base substrate is often referred to in the art as a "handle" or "handling" substrate. The base substrate may also comprise a semiconductor material other than silicon.

A wide variety of engineered substrates are known in the art and may include semiconductor materials such as, for example, silicon (Si), germanium (Ge), III-V semiconductor materials, and II-VI semiconductor materials.

For example, an engineered substrate may include an epitaxial layer of III-V semiconductor material formed on a surface of a base substrate, such as, for example, aluminum oxide ($Al_2O_3$) (which may be referred to as "sapphire"). The epitaxial layer may be formed on the surface of the base substrate by a transfer process from a donor structure, for example a donor substrate or donor ingot. The transfer from a donor structure may be desirable when the donor material is highly valuable or in scarce supply. Using such an engineered substrate, additional layers of material may be formed and processed (e.g., patterned) over the epitaxial layer of III-V semiconductor material to form one or more devices on the engineered substrate. However, the Coefficient of Thermal Expansion (CTE) mismatch (or difference) between the epitaxial layer and the base substrate comprising the engineered substrate, may influence the formation and processing of the additional layers of material. For example, if the CTE mismatch between the epitaxial layer and the base substrate is substantial, then the engineered substrate may be negatively impacted during the formation of additional layers of materials.

Figure 1:
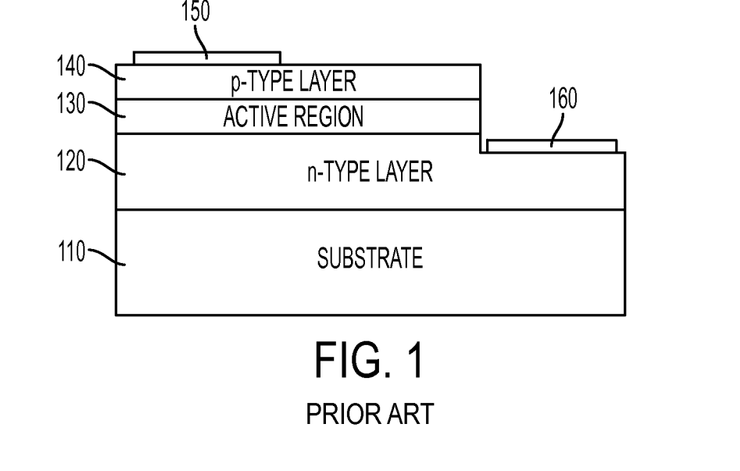
FIG. 1 is a simplified cross-section drawing of a conventional LED structure.

Examples of devices that can take advantage of engineered substrates are high power devices and photonic devices, such as, Light Emitting Diodes (LEDs) and laser diodes. FIG. 1 illustrates a conventional LED. A substrate 110, which may be an engineered substrate, includes an n-type layer 120 disposed thereon. An active region 130, which may include multiple layers, such as, for example, quantum wells, barrier layers, electron blocking layer(s) (EBL) etc., is disposed between the n-type layer 120 and a p-type layer 140. The result is an LED formed by the n-type layer 120, the active region 130, and the p-type layer 140. A first contact 160 provides an electrical connection to the n-type layer 120 and a second contact 150 provides another electrical connection to the to the p-type layer 140. These contacts may be opaque to the wavelength of light emitted by the LED and, as a result, may diminish the overall amount of light available from the LED. Thus, only the area between the first contact 160 and the second contact 150 may produce significant amounts of light. The physical layout of the second contact 150 relative to the n-type layer 120 may cause current crowding in the current flowing between the p-type layer 140 and the n-type layer 120. In addition, the physical layout may require that both p-type and n-type contacts are disposed on an upper surface of the LED structure, wherein such a physical layout may require removal of a portion of the device layers to expose regions for contacting. The removal of a portion of the device layers may increase the complexity of device fabrication, may reduce the area available for light generation and may also decrease device yield.

In view of the above, and for other reasons discussed below, there is a need for a substrate technology that provides a suitable base substrate for donated material from a donor structure. Moreover, there is a need for devices and methods that provide a support substrate with a closely matching CTE with that of an engineered substrate.

BRIEF SUMMARY

The various embodiments of the present disclosure generally relate to engineered substrates and methods of producing the engineered substrates that provide a suitable base substrate with a CTE that closely matches a CTE of the engineered substrate.

This summary is provided to introduce a selection of concepts in a simplified form that are further described in the detailed description below of some example embodiments of the disclosure. This summary is not intended to identify key features or essential features of the claimed subject matter, nor is it intended to be used to limit the scope of the claimed subject matter.

In some embodiments, the present disclosure includes methods of fabricating a semiconductor substrate. The methods include forming a weakened zone in a donor structure at a predetermined depth to define a transfer layer between an attachment surface and the weakened zone and a residual donor structure between the weakened zone and a surface opposite the attachment surface. A substrate layer is formed on the attachment surface. The substrate layer exhibits a CTE closely matching a CTE of the transfer layer, and has sufficient stiffness to provide structural support to the transfer layer. The transfer layer is separated from the donor structure at the weakened zone to form a composite substrate comprising the transfer layer and the substrate layer.

In additional embodiments, the present disclosure includes methods of fabricating a semiconductor substrate. The methods include forming a weakened zone in a donor structure at a predetermined depth to define a transfer layer between an attachment surface and the weakened zone and a residual donor structure between the weakened zone and a surface opposite the attachment surface. An ohmic contact is formed between the transfer layer and a contact layer disposed thereon. A low impedance coupling is formed between a substrate layer and the contact layer, wherein the substrate layer provides a structural support for the semiconductor substrate. The methods also include separating the transfer layer from the donor structure at the weakened zone to form a composite substrate comprising the transfer layer, the contact layer, and the substrate layer.

In other embodiments, the present disclosure comprises a semiconductor substrate including a substrate layer configured to provide a sufficient stiffness to the semiconductor substrate. The semiconductor substrate also includes a transfer layer comprising a semiconductor material in contact with an attachment surface of the substrate layer. The transfer layer may be detached from a donor structure comprising the semiconductor material and including a weakened zone in the donor structure at a predetermined depth from the attachment surface to define the transfer layer between the attachment surface and the weakened zone. The substrate layer exhibits a CTE that closely matches a CTE exhibited by the transfer layer.

In additional embodiments, the disclosure includes methods of fabricating a semiconductor substrate. In accordance with such methods, a composite substrate layer is formed over a surface of a first semiconductor layer. At least one additional semiconductor layer is epitaxially grown over the first semiconductor layer on a side thereof opposite the composite substrate layer, and the composite substrate layer is formulated to exhibit a CTE closely matching a CTE of at least one of the first semiconductor layer and the at least one additional semiconductor layer.

In additional embodiments, the present disclosure includes semiconductor structures comprising a composite substrate layer, a first semiconductor layer disposed over a surface of the composite substrate layer, and at least one additional semiconductor layer epitaxially deposited over the first semiconductor layer on a side thereof opposite the composite substrate layer. The composite substrate layer exhibits a CTE closely matching a CTE of at least one of the first semiconductor layer and the at least one additional semiconductor layer.

Further aspects, details, and alternate combinations of the elements of embodiments of the disclosure will be apparent from the following detailed description.

BRIEF DESCRIPTION OF THE DRAWINGS

Embodiments of the present disclosure may be understood more fully by reference to the following detailed description of example embodiments of the present disclosure, which are illustrated in the appended figures in which.

DETAILED DESCRIPTION OF EMBODIMENTS OF THE DISCLOSURE

The illustrations presented herein are not meant to be actual views of any particular material, device, or method, but are merely idealized representations that are employed to describe embodiments of the present disclosure.

It should be understood that any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. Also, unless stated otherwise, a set of elements may comprise one or more elements.

The following description provides specific details, such as material types and processing conditions, in order to provide a thorough description of embodiments of the present disclosure and implementation thereof. However, a person of ordinary skill in the art will understand that the embodiments of the present disclosure may be practiced without employing these specific details and in conjunction with conventional fabrication techniques. In addition, the description provided herein does not form a complete process flow for manufacturing a semiconductor device or system. Only those process acts and structures necessary to understand the embodiments of the present disclosure are described in detail herein. The materials described herein may be formed (e.g., deposited or grown) by any suitable technique including, but not limited to, spin-coating, blanket coating, Bridgeman and Czochralski processes, chemical vapor deposition ("CVD"), plasma enhanced chemical vapor deposition ("PECVD"), plasma spray coating, atomic layer deposition ("ALD"), plasma enhanced ALD, or physical vapor deposition ("PVD"). While the materials described and illustrated herein may be formed as layers, the materials are not limited to layers and may be formed in other three-dimensional configurations.

Terms such as "horizontal" and "vertical," as used herein, define relative positions of elements or structures with respect to a major plane or surface of a semiconductor structure (e.g., wafer, die, substrate, etc.), regardless of the orientation of the semiconductor structure, and are orthogonal dimensions interpreted with respect to the orientation of the structure being described. As used herein, the term "vertical" means and includes a dimension substantially perpendicular to the major surface of a semiconductor structure, and the term "horizontal" means a dimension substantially parallel to the major surface of the semiconductor structure.

As used herein, the term "semiconductor structure" means and includes any structure that is used in the formation of a semiconductor device. Semiconductor structures include, for example, dies and wafers (e.g., carrier substrates and device substrates), as well as assemblies or composite structures that include two or more dies and/or wafers three-dimensionally integrated with one another. Semiconductor structures also include fully fabricated semiconductor devices, as well as intermediate structures formed during fabrication of semiconductor devices. Semiconductor structures may comprise conductive materials, semiconductor materials, non-conductive materials (e.g., electrical insulators), and combinations thereof.

As used herein, the term "processed semiconductor structure" means and includes any semiconductor structure that includes one or more at least partially formed device structures. Processed semiconductor structures are a subset of semiconductor structures, and all processed semiconductor structures are semiconductor structures.

As used herein, the term "III-V semiconductor material" means and includes any semiconductor material that is at least predominantly comprised of one or more elements from group IIIA of the periodic table (e.g., B, Al, Ga, In, and Ti) and one or more elements from group VA of the periodic table (e.g., N, P, As, Sb, and Bi).

Unless specified differently, as used herein, the terms "coefficient of thermal expansion" and "CTE," when used with respect to a material or structure, are synonymous and mean the average linear coefficient of thermal expansion of the material or structure at room temperature.

As used herein, the term "engineered substrate," in its broadest sense, means and includes any substrate comprising two or more layers of material and that is intended to be used as a substrate for the fabrication of one or more semiconductor devices thereon. Engineered substrates include, as non-limiting examples, semiconductor-on-insulator type substrates.

As used herein, the term "sufficient stiffness" means a stiffness for a semiconductor structure that provides enough stiffness that significant structural damage due to plastic or elastic deformation does not occur to the semiconductor structure during subsequent processing or handling. As non-limiting examples, such structural damage may include dislocations, cracks, crystal lattice damage, warp, bow, and layer separation.

As used herein, the term "composite substrate layer" means a layer of a substrate comprising an alloy or mixture of two or more elemental constituents. The microstructure of some composite substrate layers may be at least substantially comprised of a single, generally homogeneous phase, or a single, inhomogeneous phase. The microstructure of other composite substrate layers may comprise two or more distinct phases, each of which may be homogeneous or inhomogeneous. Such composite substrate layers may comprise one or more metal phases, one or more ceramic phases, one or more semiconductor phases, or a mixture of one or more of metal phases, ceramic phases, and semiconductor phases. Thus, composite substrate layers may include, but are not limited to, metal-metal composite materials, ceramic-ceramic composite materials, and metal-ceramic composite materials.

The various embodiments of the present disclosure are concerned with engineered substrates and methods of producing the engineered substrates that provide a suitable base substrate layer with a CTE that closely matches a CTE of a semiconductor material carried on the base substrate layer.

Embodiments of the disclosure may have applications to engineered substrates comprising a wide range of semiconductor materials, such as silicon, germanium, silicon carbide, and III-V semiconductor materials. For example, the methods and structures of the embodiments of the disclosure may be applied to III-nitrides, III-arsenides, III-phosphides and III-antimonides, in binary, ternary, quaternary, and quinary form.

Figure 2:
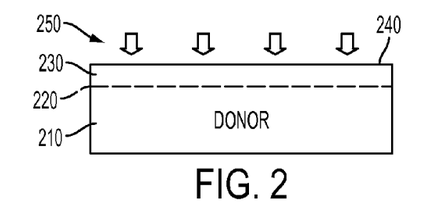
FIG. 2 is a simplified cross-section drawing of a donor structure with a weakened zone to create a transfer layer.

FIG. 2 is a simplified cross-section drawing of a donor structure 210 with a weakened zone 220 to create a first semiconductor layer 230. As non-limiting examples, a detachment process described herein may use SMART-CUT™ technology. Such processes are described in detail in, for example, U.S. Pat. No. RE39,484, issued Feb. 6, 2007, to Bruel; U.S. Pat. No. 6,303,468, issued Oct. 16, 2001, to Aspar et al.; U.S. Pat. No. 6,335,258, issued Jan. 1, 2002, to Aspar et al.; U.S. Pat. No. 6,756,286, issued Jun. 29, 2004, to Moriceau et al.; U.S. Pat. No. 6,809,044, issued Oct. 26, 2004, to Aspar et al.; U.S. Pat. No. 6,946,365, issued Sep. 20, 2005, to Aspar et al.; U.S. Pat. No. 7,531,428, issued May 12, 2009, to Dupont; U.S. Pat. No. 6,858,107, issued Feb. 22, 2005, to Ghyselen et al.; and U.S. Pat. No. 6,867,067, issued Mar. 15, 2005, to Ghyselen et al.; the disclosures of each of which are incorporated herein in their entirety by this reference. However, it should be understood that other processes suitable for manufacturing a compound material wafer that include utilizing predetermined weakened areas could also be used.

To perform the detachment process, a predetermined weakened zone 220 may be formed in the donor structure 210. FIG. 2 shows use of the SMART-CUT™ technology wherein atomic species 250, such as one or more of hydrogen ions, helium ions or other inert gas ions, are implanted through an attachment surface 240 with a dose and energy to create the weakened zone 220 in the donor structure 130. The weakened zone 220 is substantially parallel to the main attachment surface 240 and at a predetermined depth based on parameters of the atomic species implant process.

The first semiconductor layer 230 is thus formed between the attachment surface 240 and the weakened zone 220. In addition, a residual donor structure is formed between the weakened zone 220 and an opposite surface from the attachment surface 240.

The donor structure 210 includes a semiconductor material such as silicon, germanium, a III-V semiconductor material such as a III-nitride (e.g., GaN, InGaN, AlGaN), a II-VI semiconductor material, or SiC. The semiconductor material may be un-doped or, for some applications, doped n-type or p-type (e.g., highly doped (n+ or p+), moderately doped (n or p), or lightly doped (n− or p−). The semiconductor may be a freestanding wafer as shown in FIG. 2 or a multilayer wafer (e.g., GaN on a sapphire base). The donor structure 210 may also comprise at least a portion of an ingot (or boule) of semiconductor material, and, in some embodiments, the at least a portion of the ingot (or boule) may include any of the semiconductor materials mentioned above. The ingot (or boule) may comprise a structure such as those described in U.S. Pat. No. 6,858,107 issued Feb. 22, 2005 to Ghyselen et al., and U.S. Pat. No. 6,867,067 issued Mar. 15, 2005 to Ghyselen et al., the disclosures of each of which are incorporated herein in their entirety by this reference.

If the donor structure 210 is a III-nitride material, the polarity of the surface being implanted should be considered in determining the polarity of the final composite substrate. As a non-limiting example, a GaN donor structure may be used to develop a Gallium-polar face or a Nitrogen-polar face for subsequent processing. As a further non-limiting example, an InGaN donor structure may be used to develop a metal-polar face or a Nitrogen-polar face for subsequent processing.

For conventional layer transfer to a carrier wafer, typically a bonding process is used followed by splitting off of the implanted wafer by means of some heat treatment. The bonding process requires a high quality of the surfaces to be bonded to avoid large area defects (non-transferred areas) while the CTE of both wafers should not be too different to avoid wafer breakage as a result of the splitting process. For some applications, conductive bonding of a semiconductor material to a conductive substrate is desirable to construct vertical device structures, i.e., devices that have the active area near the surface of the semiconductor layer and a contact area near the interface of the semiconductor with the substrate or carrier wafer.

However, such an approach is difficult to realize as today many bonding processes involve layers of silicon dioxide (SiO$_2$) on the bonding faces to ensure a high quality bond. However, SiO$_2$ is an insulator and will make electrical conduction difficult, if not impossible, and, in addition, impede efficient heat dissipation of the device to the substrate.

As a result, embodiments of the present disclosure provide structures and processes for providing a support structure that may provide heat dissipation and with a CTE that closely matches a CTE of the first semiconductor layer 230 or a device structure formed thereon. In some embodiments, an electrical contact may be developed, for example, an ohmic or Schottky contact, between the first semiconductor layer 230 and an electrically conductive contact layer, which may comprise a metal or metal alloy in some embodiments. An ohmic contact (i.e., a contact with a voltage-independent resistance) is developed at a metal-semiconductor junction if the Schottky barrier height is zero or negative. In other words, an ohmic contact will have current-versus-voltage characteristics that are substantially linear and symmetric. In such cases, the carriers are free to flow in or out of the semiconductor so that there is a minimal resistance across the ohmic contact.

Figure 3A:
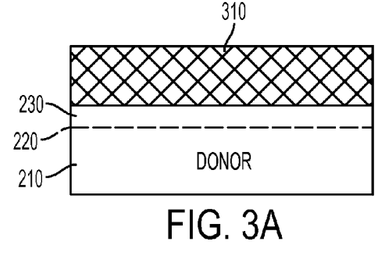
FIGS. 3A-3B are simplified cross-section drawings illustrating development of a composite substrate with a substrate layer and a transfer layer according to additional embodiments of the disclosure.
Figure 3B:
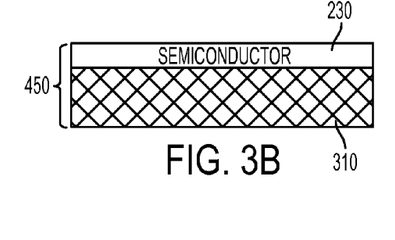

FIGS. 3A-3B are simplified cross-section drawings illustrating development of a composite engineered semiconductor substrate with a substrate layer 310 and a first semiconductor layer 230 according to additional embodiments of the disclosure. The first semiconductor layer 230 may be transferred to the substrate layer 310, as described herein, and thus may comprise a "transferred layer." The substrate layer 310 may be formed to a thickness sufficient to form a metallic support substrate with sufficient stiffness to provide structural support to the first semiconductor layer 230.

The substrate layer 310 may have an average thickness (measured perpendicular to the major planar surfaces of the substrate layer) that is sufficient to provide sufficient stiffness for structurally supporting the first semiconductor layer 230. As non-limiting examples, the substrate layer 310 may have an average thickness of at least about five (5) microns, or at least about ten (10) microns. In some embodiments, the substrate layer 310 may have an average thickness between about ten (10) microns and about one hundred (100) microns, and, more likely, between about ten (10) microns and about twenty (20) microns.

The substrate layer 310 may be formed on the attachment surface 240 with a process suitable for providing an electrical contact, for example ohmic contact, between the substrate layer 310 and the first semiconductor layer 230. Prior to depositing the substrate layer 310, the surface of the semiconductor may need treatment to remove any surface oxide or other surface layers that may impact the quality of the substrate layer 310. For example, a thin gallium oxide layer may need to be removed from the first semiconductor layer 230 when the first semiconductor layer 230 comprises gallium nitride, prior to depositing the substrate layer 310 and for the formation of an electrical contact, e.g., an ohmic contact.

As non-limiting examples, the substrate layer 310 may be deposited using one or more of a physical deposition process (e.g., physical vapor deposition (PVD), sputtering, etc.), a plasma spray coating process, a plating process (e.g., an electroless plating process and/or an electroplating process), and a chemical vapor deposition process (CVD).

The substrate layer 310 may have (i.e., exhibit) a CTE that closely matches a CTE of the first semiconductor layer 230 and/or additional semiconductor material deposited on the first semiconductor layer 230 during subsequent growth processes, which may reduce or prevent strain and cracking in the first semiconductor layer 230 and/or the additional semiconductor material deposited on the first semiconductor layer 230 during subsequent growth processes. Table 1 below lists CTE values for some non-limiting materials for the first semiconductor layer 230 and the substrate layer 310 in some example embodiments of the disclosure.

TABLE 1

| Material Class | Material | CTE ($10^{-6}$/° K) |
|---|---|---|
| Semiconductors | GaN | 5.6 |
| | GaAs | 5.4 |
| | SiC | 4.5 |
| | Si | 2.5 |
| Metals | Tungsten | 4.5 |
| | Molybdenum | 5.5 |
| | Zirconium | 5.7 |
| | Hafnium | 6.1 |
| | Rhenium | 6.2 |

TABLE 1-continued

| Material Class | Material | CTE ($10^{-6}$/° K) |
|---|---|---|
| Ceramics | Tantalum | 6.5 |
| | Silicon Oxide ($SiO_2$) | 0.5 |
| | Sapphire ($Al_2O_3$) | 8.6 |
| | Mullite ($SiO_2/Al_2O_3$) | 4.5 |
| | | (51% $SiO_2$/49% $Al_2O_3$) |

In some embodiments, the CTE of the substrate layer 310 may be within about 20%, within about 10%, within about 5%, within about 2%, or even within about 1% of the CTE of the first semiconductor layer 230 and/or any additional semiconductor material or materials ultimately deposited over the first semiconductor layer 230, as described herein.

In some embodiments, the substrate layer 310 may comprise a refractory metal or a refractory metal alloy. For these embodiments, tungsten, molybdenum, and zirconium (and particularly tungsten) used as the substrate layer 310 would have a CTE closely matching a CTE of a SiC first semiconductor layer 230. Similarly, for these embodiments, zirconium, hafnium, rhenium, and tantalum used as the substrate layer 310 would closely match a GaN first semiconductor layer 230 and in some embodiments particularly molybdenum.

In additional embodiments, the substrate layer 310 may comprise a composite substrate layer, which includes two or more elements so as to provide the substrate layer 310 with a CTE between those of the two or more elements of which the substrate layer 310 is composed. For example, the substrate layer 310 may comprise an alloy or mixture of two or more elements. In such embodiments, the microstructure of the substrate layer 310 may be at least substantially comprised of a single, generally homogeneous phase, the substrate layer 310 may be at least substantially comprised of a single, inhomogeneous phase, or the substrate layer 310 may comprise two or more distinct phases, each of which may be homogeneous or inhomogeneous. In such embodiments, the substrate layer 310 may comprise one or more metal phases, one or more ceramic phases, one or more semiconductor phases, or a mixture of one or more of metal phases, ceramic phases, and semiconductor phases. Thus, the substrate layer may be formulated to comprise one of a metal-metal composite material, a ceramic-ceramic composite material, and a metal-ceramic composite material.

The entire structure including the donor structure 210 and the substrate layer 310 shown in FIG. 3A may be placed into a furnace (not shown) and heated so that the weakened zone 220 may be further weakened. With the weakening, the first semiconductor layer 230 and accompanying substrate layer 310 may be separated from the donor structure at the weakened zone 220. In addition to, or in place of thermal energy, other forms of energy, such as mechanical energy or chemical energy, may be used to weaken the structure along the weakened zone 220 and ultimately separate the first semiconductor layer 230 from the remainder of the donor structure 210.

The structures thus formed after the separation are a residual donor structure (not shown) capable of donating further thin transfer layers, and an engineered substrate 450 shown in FIG. 3B, which includes the substrate layer 310 and the first semiconductor layer 230. As non-limiting examples, the first semiconductor layer 230 may have an average layer thickness measured perpendicular to the major planar surfaces of the engineered substrate 450 of about one thousand (1,000) nanometers or less, about five hundred (500) nanometers or less, or even about one hundred (100) nanometers or less.

As shown in FIG. 3B, the engineered substrate 450 may be flipped over for additional processing on the exposed surface of the first semiconductor layer 230. Prior to performing any further processing steps, the engineered substrate 450 may receive a surface treatment, such as, for example, polishing, cleaning, or combinations thereof. Additional processing may include, as a non-limiting example, adding device structures on the engineered substrate 450. The device structures may include multiple layers of doped semiconductor material, un-doped semiconductor material, and active areas as are known in the art to produce electronic elements, photonic elements, and combinations thereof.

Figure 4A:
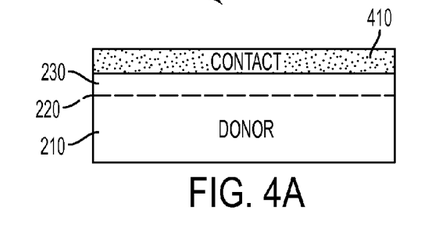
FIGS. 4A-4C are simplified cross-section drawings illustrating development of a composite substrate with a substrate layer, a transfer layer, and a contact layer therebetween according to additional embodiments of the disclosure.
Figure 4B:
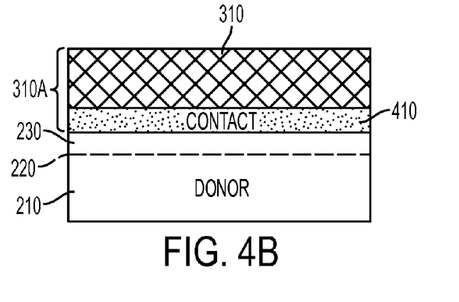
Figure 4C:
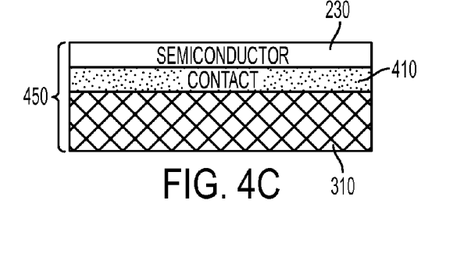

FIGS. 4A-4C are simplified cross-section drawings illustrating development of an engineered substrate 450 with a substrate layer 310, a first semiconductor layer 230, and a contact layer 410 therebetween according to additional embodiments of the disclosure.

In the embodiments of FIGS. 4A-4C, a contact layer 410 comprising an electrically conductive material, such as a metal or metal alloy, is deposited on the attachment surface 240 of the donor structure 210 (FIG. 2) to form the structure shown in FIG. 4A. This contact layer 410 is configured to provide an ohmic contact that is of high quality (e.g., low resistance) between the first semiconductor layer 230 and the contact layer 410. As a non-limiting example, if the donor material of the donor structure 210 is n+ doped GaN, then the contact layer 410 may be, e.g., a Ti/Al/Ni/Au stack, or a Ti/Al stack when the use of gold may be detrimental to the device performance. As another non-limiting example, if the donor material of the donor structure 210 is p+ doped GaN, the contact layer 410 may be, e.g., a Ni/Au stack or Ni (the first metal in the list being closest to the semiconductor).

Prior to depositing the contact layer 410, the surface 240 of the semiconductor layer 230 may need treatment to remove any surface oxide or other surface layers which may impact the quality of the contact layer 410, e.g., a thin gallium oxide layer may need to be removed prior to depositing the contact layer 410. The contact layer 410 may be deposited by sputter coating, thermal evaporation, e-beam evaporation, etc. In some embodiments, the contact layer 410 may also function as a seed metal for subsequent deposition of a thick metal support. The contact layer 410 may improve adhesion with the first semiconductor layer 230, and may improve electrical conduction properties with the first semiconductor layer 230.

The contact layer 410 may be as thin as a few monolayers of atoms. In some embodiments, the contact layer 410 may have an average thickness of between about one (1) nanometer and about fifty (50) nanometers.

As shown in FIG. 4B, a substrate layer 310 is formed on the contact layer 410 with a process suitable for providing a low-impedance coupling between the substrate layer 310 and the contact layer 410. In the embodiments of FIGS. 4A-4C, the combination of the contact layer 410 and the substrate layer 310 may be referred to herein as a multi-layer substrate 310A.

The entire structure of FIG. 4B, which includes the donor structure 210 and the multi-layer substrate 310A, may be placed into a furnace (not shown) and heated so that the weakened zone 220 may be further weakened. With the weakening, the first semiconductor layer 230 and accompanying multi-layer substrate 310A may be separated from the donor structure 210 at the weakened zone 220, as previously described with reference to FIG. 3A.

The structures thus formed after the separation are a residual donor structure (not shown) capable of donating further thin transfer layers and an engineered substrate 450 including the substrate layer 310, the contact layer 410, and the first semiconductor layer 230.

As shown in FIG. 4C, the engineered substrate 450 may be flipped over for additional processing on the exposed surface of the first semiconductor layer 230, as previously described with reference to FIG. 3B.

In the embodiments of FIGS. 3A-3B and FIGS. 4A-4C, the substrate layer 310 should be able to remain chemically and physically stable at temperatures high enough for subsequent processing, such as, for example, the heating for the separation and growth/deposition/processing of additional layers of material. As a non-limiting example, for subsequent processing of additional GaN layers, the substrate layer 310 should be able to withstand temperatures in the range of about 900° C. to about 1100° C. In addition, for subsequent processing, the substrate layer 310 should be able to withstand the chemical environment within the additional growth/deposition/processing equipment.

As previously mentioned, the substrate layer 310 may have (i.e., exhibit) a CTE that closely matches a CTE of the first semiconductor layer 230 and/or additional semiconductor material deposited on the first semiconductor layer 230 during subsequent growth processes, which may reduce or prevent strain and cracking in the first semiconductor layer 230 and/or the additional semiconductor material deposited on the first semiconductor layer 230 during subsequent growth processes.

Figure 5:
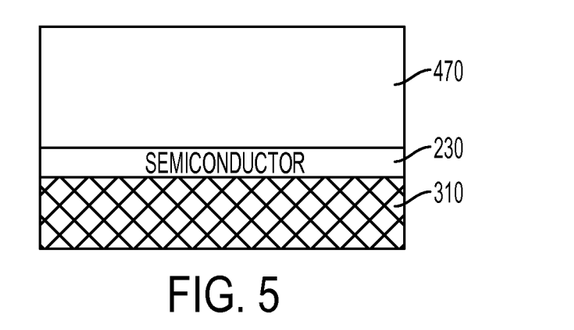
FIG. 5 is a simplified cross-section drawing illustrating additional semiconductor material deposited over a semiconductor material of the structure of FIG. 3B.
Figure 6:
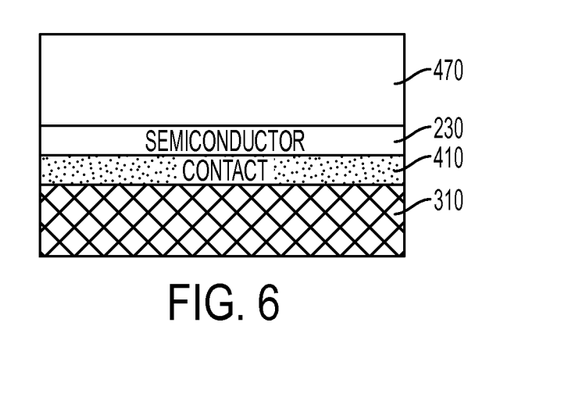
FIG. 6 is a simplified cross-section drawing illustrating additional semiconductor material deposited over the semiconductor material of the structure of FIG. 4C.

FIG. 5 illustrates a relatively thick volume of additional semiconductor material 470 epitaxially deposited over the first layer of semiconductor material 230 of FIG. 3B. Similarly, FIG. 6 illustrates a relatively thick volume of additional semiconductor material 470 epitaxially deposited over the first layer of semiconductor material 230 of FIG. 4C. The thick volume of additional semiconductor material 470 of FIGS. 5 and 6 may comprise a single additional layer of semiconductor material, or it may comprise a plurality of additional layers of semiconductor material epitaxially deposited over the first layer of semiconductor material 230, as described below with reference to FIGS. 7A-7C and 8A-8D.

As the CTE of the substrate layer 310 closely matches the CTE of the first semiconductor layer 230 and/or the volume of additional semiconductor material 470, the volume of additional semiconductor material 470 may be grown to relatively high thickness without cracking in order to complete the fabrication of a device structure.

As a non-limiting example, the volume of additional semiconductor material 470 may have an average total thickness of at least about one hundred (100) nanometers or at least about five hundred (500) nanometers. In some embodiments, the volume of additional semiconductor material 470 may have an average total thickness of between about one (1) micron and about one hundred (100) microns.

Some non-limiting examples of compositions for the substrate layer 310, the first semiconductor layer 230, and the volume of additional semiconductor material 470 are set forth in Table 2 below.

TABLE 2

| Example Number | Substrate layer 310 | First Semiconductor Layer 230 | Additional Semiconductor Material 470 |
|---|---|---|---|
| 1 | W | SiC | SiC |
| 2 | Mo | SiC | SiC |
| 3 | Mo | GaAs | GaAs |
| 4 | Zr | GaN | GaN |
| 5 | Zr | GaN | GaAs |
| 6 | Mo | GaN | GaN |
| 7 | Ta/W Alloy | GaN | GaN |
| 8 | Ta/W Alloy | GaN | SiC |
| 9 | Ta/W Alloy | SiC | GaN |
| 10 | Ta/W Alloy | SiC | SiC |
| 11 | $SiO_2/Al_2O_3$ Composite | Si | Si |
| 12 | $SiO_2/Al_2O_3$ Composite | SiC | SiC |
| 13 | $SiO_2/Al_2O_3$ Composite | GaN | GaN |

In the compositions of Example Numbers 7 through 10 set forth in Table 2, the percentages of the different elements or phases in the materials of the substrate layers 310 may be tailored to render the CTE of the substrate layer 310 closer to the CTE of the first semiconductor layer 230 and/or the volume of additional semiconductor material 470. For example, the Rule of Mixtures may be used to predict the CTE of the substrate layer 310 when the substrate layer 310 comprises a mixture of two or more phases using the relative volumetric percentages of the two or more phases in the composite material of such a substrate layer 310. According to the rule of mixtures (for isotropic properties), the CTE of a two-phase composite material is given by the equation:

$$\alpha_C = \alpha_1(V_1) + \alpha_2(V_2).$$

wherein $\alpha_C$ is the CTE of the composite material, $\alpha_1$ is the CTE of the first phase in the composite material, $\alpha_2$ is the CTE of the second phase in the composite material, $V_1$ is the volume fraction of the first phase in the composite material, and $V_2$ is the volume fraction of the second phase in the composite material.

Thus, in the composition of Example Number 11, the composite substrate layer 310 may comprise about seventy five (75) percent by volume silicon oxide ($SiO_2$) and about twenty five (25) percent by volume aluminum oxide ($Al_2O_3$), such that the composite material of the substrate layer 310 including the 75 vol % $SiO_2$ and the 25 vol % percent $Al_2O_3$ is predicted to exhibit a CTE of about 2.5, which is equal to that exhibited by the silicon of the first semiconductor layer 230 and the volume of additional semiconductor material 470 according to the Rule of Mixtures (i.e., 2.5=0.5(0.75)+8.6 (0.25)).

Similarly, in the composition of Example Number 12, the composite substrate layer 310 may comprise about fifty one (51) percent by volume silicon oxide ($SiO_2$) and about forty nine (49) percent by volume aluminum oxide ($Al_2O_3$), such that the composite material of the substrate layer 310 including the 51 vol % $SiO_2$ and the 49 vol % percent $Al_2O_3$ is predicted to exhibit a CTE of about 4.5, which is equal to that exhibited by the silicon carbide of the first semiconductor layer 230 and the volume of additional semiconductor material 470 according to the Rule of Mixtures (i.e., 4.5=0.5 (0.51)+8.6(0.49)).

Figure 7A:
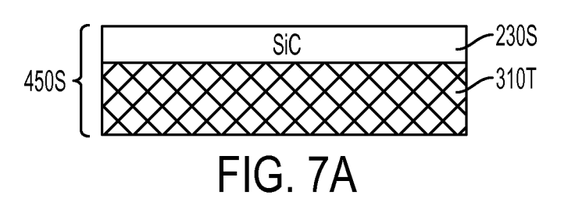
FIGS. 7A-7C illustrate a composite substrate with a silicon carbide (SiC) transfer layer and a high power electronic device formed on the composite substrate according to additional embodiments of the disclosure.
Figure 7B:
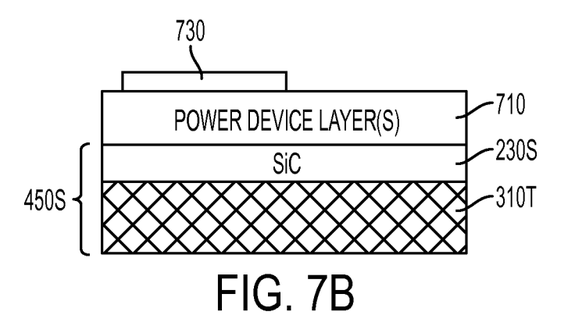
Figure 7C:
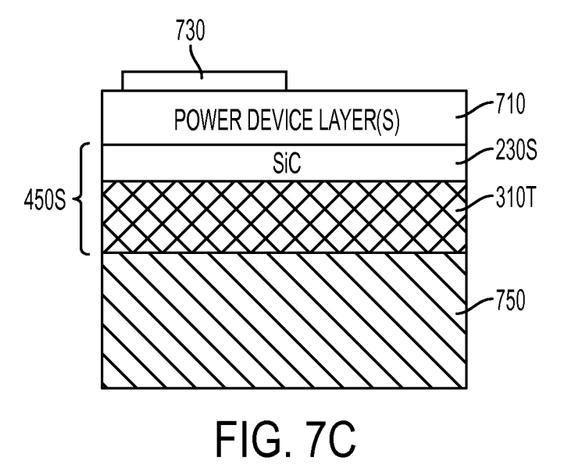

FIGS. 7A-7C illustrate an engineered substrate 450S with a silicon carbide (SiC) first semiconductor layer 230S and a high power electronic device formed on the engineered substrate 450S according to additional embodiments of the disclosure. The engineered substrate 450S includes the SiC first semiconductor layer 230S on the substrate layer 310. The substrate layer may comprise a tungsten layer 310T in some embodiments. As shown in Table 1, the SiC first semiconductor layer 230 and the tungsten layer 310T have closely matching in CTEs, such that the SiC first semiconductor layer 230 and high power electronic device formed thereon will experience little or no strain effects due to a CTE mismatch during device formation. In other embodiments, the substrate layer 310 may comprise an $SiO_2/Al_2O_3$ composite layer, as previously described.

As illustrated in FIG. 7B, a power device may be formed with one or more power device layers 710 on the SiC first semiconductor layer 230S. A contact layer 730 provides an electrical connection to the power device layer 710.

FIG. 7C illustrates an optional thick substrate 750 bonded to the engineered substrate 4505.

FIGS. 8A-8D illustrate a composite substrate with an n-doped gallium nitride (GaN) first semiconductor layer 230 and a photonic device formed on the engineered substrate 450, which is flipped to form an n-layer-up photonic device according to additional embodiments of the disclosure.

Figure 8A:
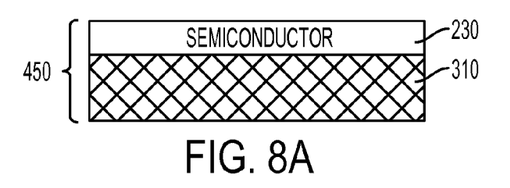
FIGS. 8A-8D illustrate a composite substrate with an n-doped gallium nitride (GaN) transfer layer and a photonic device formed on the composite substrate, which is flipped to form an n-layer-up photonic device according to additional embodiments of the disclosure.

The layers in the embodiment of FIG. 8A are similar to those of the embodiments of FIG. 3B. A photonic device, such as, for example, an LED may be formed on the semiconductor material 230, which is formed as an n-doped gallium nitride (GaN) first semiconductor layer 230N in this embodiment.

Figure 8B:
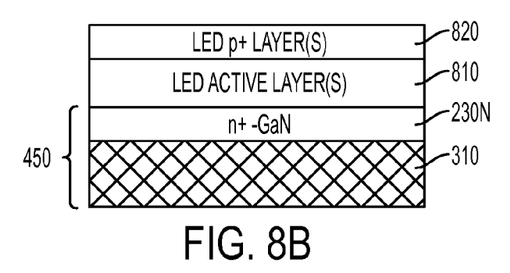

As shown in FIG. 8B, the photonic device may includes an active region 810, which may include multiple layers of semiconductor material, such as quantum wells, disposed on the n-type gallium nitride (GaN) first semiconductor layer 230N. One or more p-type GaN layers 820 may be disposed on the active layer 810. The result is an LED formed by the n-type gallium nitride (GaN) first semiconductor layer 230N, the active layer 810, and the p-type layer 820.

Figure 8C:
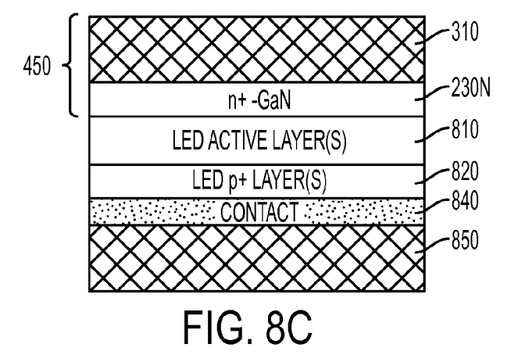

With the photonic device structure formed, a contact layer 840, such as those described above, may be formed on the p-type GaN layer 820 providing an electrical connection to the p-type layer 820. A heat sink, such as a thick substrate 850 comprising a metal may be formed on the contact layer 840. The resulting structure may be characterized as being flipped relative to previously described embodiments. The flipped configuration is illustrated in FIG. 8C. The substrate layer 310 may then be removed to expose the n-type gallium nitride (GaN) first semiconductor layer 230N.

Figure 8D:
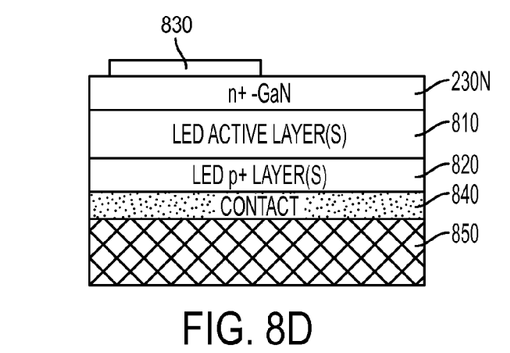

The resulting LED structure provides a vertical diode structure, which, in contrast to the diode structure in FIG. 1, does not need an additional electrical connection exposed on the top layers for connection to the p-side of the diode. Rather, the p-side of the diode may be contacted through the contact layer 840 and the thick substrate 850. A contact layer 830 may be formed to provide an electrical connection to an n-doped gallium nitride (GaN) first semiconductor layer 230N.

Additional non-limiting example embodiments are disclosed below.

Embodiment 1: A method of fabricating a semiconductor substrate, comprising: forming a composite substrate layer over a surface of a first semiconductor layer; epitaxially growing at least one additional semiconductor layer over the first semiconductor layer on a side thereof opposite the composite substrate layer; and formulating the composite substrate layer to exhibit a Coefficient of Thermal Expansion (CTE) closely matching a CTE of at least one of the first semiconductor layer and the at least one additional semiconductor layer.

Embodiment 2: The method of Embodiment 1, further comprising selecting the first semiconductor layer to comprise a portion of a donor structure for donating the first semiconductor layer to another structure comprising the composite substrate layer.

Embodiment 3: The method of Embodiment 2, further comprising forming a weakened zone in the donor structure at a predetermined depth to define the first semiconductor layer between the surface of the first semiconductor layer and the weakened zone and a residual donor structure between the weakened zone and a surface of the donor structure opposite the surface of the first semiconductor layer.

Embodiment 4: The method of Embodiment 3, further comprising separating the first semiconductor layer from the donor structure at the weakened zone to form a substrate structure comprising the first semiconductor layer and the composite substrate layer.

Embodiment 5: The method of any one of Embodiments 1 through 4, wherein forming a composite substrate layer over a surface of a first semiconductor layer comprises: forming a metallic contact layer on the surface of the first semiconductor layer; and forming the composite substrate layer on the metallic contact layer on a side thereof opposite the first semiconductor layer.

Embodiment 6: The method of any one of Embodiments 1 through 5, wherein formulating the composite substrate layer to exhibit a CTE closely matching a CTE of at least one of the first semiconductor layer and the at least one additional semiconductor layer comprises formulating the composite substrate layer to exhibit a CTE within about 5% a CTE of the at least one of the first semiconductor layer and the at least one additional semiconductor layer.

Embodiment 7: The method of Embodiment 6, wherein formulating the composite substrate layer to exhibit a CTE within about 5% a CTE of the at least one of the first semiconductor layer and the at least one additional semiconductor layer comprises formulating the composite substrate layer to exhibit a CTE within about 2% a CTE of the at least one of the first semiconductor layer and the at least one additional semiconductor layer.

Embodiment 8: The method of Embodiment 7, wherein formulating the composite substrate layer to exhibit a CTE within about 2% a CTE of the at least one of the first semiconductor layer and the at least one additional semiconductor layer comprises formulating the composite substrate layer to exhibit a CTE within about 1% a CTE of the at least one of the first semiconductor layer and the at least one additional semiconductor layer.

Embodiment 9: The method of any one of Embodiments 1 through 8, further comprising forming the composite substrate layer to have an average thickness of at least about ten microns (10.0 µm).

Embodiment 10: The method of Embodiment 9, further comprising forming the composite substrate layer to have an average thickness of between about ten microns (10.0 µm) and about one hundred microns (100.0 µm).

Embodiment 11: The method of any one of Embodiments 1 through 10, further comprising selecting the first semiconductor layer to have an average thickness of about five hundred nanometers (500 nm) or less.

Embodiment 12: The method of Embodiment 11, further comprising selecting the first semiconductor layer to have an average thickness of about one hundred nanometers (100 nm) or less.

Embodiment 13: The method of any one of Embodiments 1 through 12, further comprising forming the at least one additional semiconductor layer to have an average total thickness of at least one hundred nanometers (100 nm).

Embodiment 14: The method of Embodiment 13, further comprising forming the at least one additional semiconductor layer to have an average total thickness of between about one micron (1.0 µm) and about one hundred microns (100.0 µm).

Embodiment 15: The method of any one of Embodiments 1 through 14, further comprising selecting the first semiconductor layer comprises a semiconductor material selected from the group consisting of silicon, germanium, III-V semiconductor material, and II-VI semiconductor material.

Embodiment 16: The method of any one of Embodiments 1 through 15, wherein formulating the composite substrate layer further comprises formulating the composite substrate layer to comprise one of a metal-metal composite material, a ceramic-ceramic composite material, and a metal-ceramic composite material.

Embodiment 17: The method of any one of Embodiments 1 through 16, further comprising: selecting at least one of the first semiconductor layer and the at least one additional semiconductor layer to comprise gallium nitride (GaN); and formulating the composite substrate layer to comprise tantalum (Ta) and tungsten (W).

Embodiment 18: The method of Embodiment 17, wherein selecting the at least one of the first semiconductor layer and the at least one additional semiconductor layer to comprise gallium nitride (GaN) comprises selecting the at least one additional semiconductor layer to comprise gallium nitride (GaN).

Embodiment 19: The method of Embodiment 18, further comprising selecting the first semiconductor layer to comprise silicon.

Embodiment 20: The method of Embodiment 18, further comprising selecting each of the first semiconductor layer and the at least one additional semiconductor layer to comprise gallium nitride (GaN).

Embodiment 21: The method of any one of Embodiments 1 through 16, further comprising: selecting at least one of the first semiconductor layer and the at least one additional semiconductor layer to comprise silicon (Si); and formulating the composite substrate layer to comprise silicon oxide ($SiO_2$) and aluminum oxide ($Al_2O_3$).

Embodiment 22: The method of Embodiment 21, wherein selecting the at least one of the first semiconductor layer and the at least one additional semiconductor layer to comprise silicon (Si) comprises selecting the at least one additional semiconductor layer to comprise silicon (Si).

Embodiment 23: The method of Embodiment 21, wherein selecting the at least one of the first semiconductor layer and the at least one additional semiconductor layer to comprise silicon (Si) comprises selecting each of the first semiconductor layer and the at least one additional semiconductor layer to comprise silicon (Si).

Embodiment 24: The method of any one of Embodiments 22 through 24, wherein formulating the composite substrate layer to comprise silicon oxide ($SiO_2$) and aluminum oxide ($Al_2O_3$) comprises formulating the composite substrate layer to comprise about seventy-five percent by volume silicon oxide ($SiO_2$) and about twenty-five percent by volume aluminum oxide ($Al_2O_3$).

Embodiment 25: The method of any one of Embodiments 1 through 16, further comprising: selecting at least one of the first semiconductor layer and the at least one additional semiconductor layer to comprise silicon carbide (SiC); and formulating the composite substrate layer to comprise silicon oxide ($SiO_2$) and aluminum oxide ($Al_2O_3$).

Embodiment 26: The method of Embodiment 26, wherein selecting the at least one of the first semiconductor layer and the at least one additional semiconductor layer to comprise silicon carbide (SiC) comprises selecting each of the first semiconductor layer and the at least one additional semiconductor layer to comprise silicon carbide (SiC).

Embodiment 27: The method of Embodiment 25 or Embodiment 26, wherein formulating the composite substrate layer to comprise silicon oxide ($SiO_2$) and aluminum oxide ($Al_2O_3$) comprises formulating the composite substrate layer to comprise about forty-nine percent by volume silicon oxide ($SiO_2$) and about fifty-one percent by volume aluminum oxide ($Al_2O_3$).

Embodiment 28: The method of any one of Embodiments 1 through 27, wherein forming the composite substrate layer over the surface of the first semiconductor layer comprises depositing the composite substrate layer over the surface of the first semiconductor layer.

Embodiment 29: The method of Embodiment 28, wherein depositing the composite substrate layer over the surface of the first semiconductor layer comprises using a plasma spray process to deposit the composite substrate layer over the surface of the first semiconductor layer.

Embodiment 30: The method of Embodiment 28 or Embodiment 29, wherein depositing the composite substrate layer over the surface of the first semiconductor layer comprises using a physical deposition process to deposit the composite substrate layer over the surface of the first semiconductor layer.

Embodiment 31: A semiconductor structure, comprising: a composite substrate layer; a first semiconductor layer disposed over a surface of the composite substrate layer; and at least one additional semiconductor layer epitaxially deposited over the first semiconductor layer on a side thereof opposite the composite substrate layer; wherein the composite substrate layer exhibits a CTE closely matching a CTE of at least one of the first semiconductor layer and the at least one additional semiconductor layer.

Embodiment 32: The semiconductor structure of Embodiment 31, further comprising a metallic contact layer disposed between the composite substrate layer and the first semiconductor layer.

Embodiment 33: The semiconductor structure of Embodiment 31 or Embodiment 32, wherein the composite substrate layer exhibits a CTE within about 5% of a CTE of at least one of the first semiconductor layer and the at least one additional semiconductor layer.

Embodiment 34: The semiconductor structure of Embodiment 33, wherein the composite substrate layer exhibits a CTE within about 2% of a CTE of at least one of the first semiconductor layer and the at least one additional semiconductor layer.

Embodiment 35: The semiconductor structure of Embodiment 34, wherein the composite substrate layer exhibits a CTE within about 1% of a CTE of at least one of the first semiconductor layer and the at least one additional semiconductor layer.

Embodiment 36: The semiconductor structure of any one of Embodiments 31 through 35, wherein the composite substrate layer has an average thickness of at least about ten microns (10.0 μm).

Embodiment 37: The semiconductor structure of Embodiment 36, wherein the composite substrate layer has an average thickness of between about ten microns (10.0 μm) and about one hundred microns (100.0 μm).

Embodiment 38: The semiconductor structure of any one of Embodiments 31 through 37, wherein the first semiconductor layer has an average thickness of about five hundred nanometers (500 nm) or less.

Embodiment 39: The semiconductor structure of Embodiment 38, wherein the first semiconductor layer has an average thickness of about one hundred nanometers (100 nm) or less.

Embodiment 40: The semiconductor structure of any one of Embodiments 31 through 39, wherein the at least one additional semiconductor layer has an average total thickness of at least one hundred nanometers (100 nm).

Embodiment 41: The semiconductor structure of Embodiment 40, wherein the at least one additional semiconductor layer has an average total thickness of between about one micron (1.0 μm) and about one hundred microns (100.0 μm).

Embodiment 42: The semiconductor structure of Embodiments 31 through 41, wherein the first semiconductor layer comprises a semiconductor material selected from the group consisting of silicon, germanium, III-V semiconductor material, and II-VI semiconductor material.

Embodiment 43: The semiconductor structure of any one of Embodiments 31 through 42, wherein the composite substrate layer comprises one of a metal-metal composite material, a ceramic-ceramic composite material, and a metal-ceramic composite material.

Embodiment 44: The semiconductor structure of any one of Embodiments 31 through 41, wherein: at least one of the first semiconductor layer and the at least one additional semiconductor layer comprises gallium nitride (GaN); and the composite substrate layer comprises tantalum (Ta) and tungsten (W).

Embodiment 45: The semiconductor structure of Embodiment 44, wherein the at least one additional semiconductor layer comprises gallium nitride (GaN).

Embodiment 46: The semiconductor structure of Embodiment 44 or Embodiment 45, wherein the first semiconductor layer comprises silicon (Si).

Embodiment 47: The semiconductor structure of Embodiment 44 or Embodiment 45, wherein each of the first semiconductor layer and the at least one additional semiconductor layer comprises gallium nitride (GaN).

Embodiment 48: The semiconductor structure of any one of Embodiments 32 through 42, wherein: at least one of the first semiconductor layer and the at least one additional semiconductor layer comprises silicon (Si); and the composite substrate layer comprises silicon oxide ($SiO_2$) and aluminum oxide ($Al_2O_3$).

Embodiment 49: The semiconductor structure of Embodiment 48, wherein the at least one additional semiconductor layer comprises silicon (Si).

Embodiment 50: The semiconductor structure of Embodiment 49, wherein each of the first semiconductor layer and the at least one additional semiconductor layer comprises silicon (Si).

Embodiment 51: The semiconductor structure of any one of Embodiments 48 through 50, wherein the composite substrate layer comprises about seventy-five percent by volume silicon oxide ($SiO_2$) and about twenty-five percent by volume aluminum oxide ($Al_2O_3$).

Embodiment 52: The semiconductor structure of any one of Embodiments 31 through 41, wherein: at least one of the first semiconductor layer and the at least one additional semiconductor layer comprises silicon carbide (SiC); and the composite substrate layer comprises silicon oxide ($SiO_2$) and aluminum oxide ($Al_2O_3$).

Embodiment 53: The semiconductor structure of Embodiment 52, wherein each of the first semiconductor layer and the at least one additional semiconductor layer comprises silicon carbide (SiC).

Embodiment 54: The semiconductor structure of Embodiment 52 or Embodiment 53, wherein the composite substrate layer comprises about forty-nine percent by volume silicon oxide ($SiO_2$) and about fifty-one percent by volume aluminum oxide ($Al_2O_3$).

The embodiments of the disclosure described above do not limit the scope the invention, since these embodiments are merely examples of embodiments of the invention, which is defined by the scope of the appended claims and their legal equivalents. Any equivalent embodiments are intended to be within the scope of this invention. Indeed, various modifications of the disclosure, in addition to those shown and described herein, such as alternate useful combinations of the elements described, will become apparent to those skilled in the art from the description. Such modifications are also intended to fall within the scope of the appended claims.

What is claimed is:

1. A method of fabricating a semiconductor substrate, comprising:
    depositing a composite substrate layer over a surface of a first semiconductor layer so as to form the composite substrate layer in place over the first semiconductor layer, and forming the composite substrate layer to have a sufficient thickness to form a support substrate with sufficient stiffness to provide structural support to the first semiconductor layer, the entire composite substrate layer is formed by one or more processes selected from the group consisting of a spin-coating process, a blanket coating process, a chemical vapor deposition (CVD) process, a plasma enhanced chemical vapor deposition (PECVD) process, a plasma spray coating process, an atomic layer deposition (ALD) process, a plasma enhanced ALD process, and a physical vapor deposition (PVD);
    epitaxially growing at least one additional semiconductor layer over the first semiconductor layer on a side thereof opposite the composite substrate layer; and
    formulating the composite substrate layer to exhibit a Coefficient of Thermal Expansion (CTE) closely matching a CTE of at least one of the first semiconductor layer and the at least one additional semiconductor layer and reducing or preventing introduction of strain in the at least one of the first semiconductor layer and the at least one additional semiconductor layer due to thermal expansion mismatch with the composite substrate layer; and
    the composite substrate layer comprises one of a ceramic-ceramic composite material, a metal-ceramic composite material, and a tantalum-tungsten composite material.

2. The method of claim 1, wherein depositing the composite substrate layer over the surface of the first semiconductor layer comprises depositing the composite substrate layer over a donor structure, a portion of the donor structure defining the first semiconductor layer, and wherein the method further comprises transferring the first semiconductor layer from the donor structure to the composite substrate layer after depositing the composite substrate layer over the donor structure.

3. The method of claim 2, further comprising forming a weakened zone in the donor structure at a predetermined depth from a first surface of the donor structure, the first semiconductor layer defined between the first surface of the donor structure and the weakened zone, a residual donor structure defined between the weakened zone and a second surface of the donor structure on an opposite side of the donor structure from the first surface.

4. The method of claim 3, wherein transferring the first semiconductor layer from the donor structure to the composite substrate layer comprises separating the first semiconductor layer from the residual donor structure at the weakened zone.

5. The method of claim 1, wherein depositing the composite substrate layer over the surface of the first semiconductor layer comprises:
forming a metallic contact layer on the surface of the first semiconductor layer; and
depositing the composite substrate layer on the metallic contact layer on a side thereof opposite the first semiconductor layer.

6. The method of claim 1, wherein formulating the composite substrate layer to exhibit the CTE closely matching the CTE of at least one of the first semiconductor layer and the at least one additional semiconductor layer comprises formulating the composite substrate layer to exhibit the CTE within about 5% of the CTE of the at least one of the first semiconductor layer and the at least one additional semiconductor layer.

7. The method of claim 6, wherein formulating the composite substrate layer to exhibit the CTE within about 5% of the CTE of the at least one of the first semiconductor layer and the at least one additional semiconductor layer comprises formulating the composite substrate layer to exhibit the CTE within about 2% of the CTE of the at least one of the first semiconductor layer and the at least one additional semiconductor layer.

8. The method of claim 7, wherein formulating the composite substrate layer to exhibit the CTE within about 2% of the CTE of the at least one of the first semiconductor layer and the at least one additional semiconductor layer comprises formulating the composite substrate layer to exhibit the CTE within about 1% of the CTE of the at least one of the first semiconductor layer and the at least one additional semiconductor layer.

9. The method of claim 1, wherein depositing the composite substrate layer comprises forming the composite substrate layer to have an average thickness of at least about ten microns (10.0 μm).

10. The method of claim 9, wherein depositing the composite substrate layer comprises forming the composite substrate layer to have an average thickness of between about ten microns (10.0 μm) and about one hundred microns (100.0 μm).

11. The method of claim 10, further comprising selecting the first semiconductor layer to have an average thickness of about five hundred nanometers (500 nm) or less.

12. The method of claim 11, further comprising selecting the first semiconductor layer to have an average thickness of about one hundred nanometers (100 nm) or less.

13. The method of claim 1, further comprising forming the at least one additional semiconductor layer to have an average total thickness of at least one hundred nanometers (100 nm).

14. The method of claim 13, further comprising forming the at least one additional semiconductor layer to have an average total thickness of between about one micron (1.0 μm) and about one hundred microns (100.0 μm).

15. The method of claim 1, further comprising selecting the first semiconductor layer to comprise a semiconductor material selected from the group consisting of silicon, germanium, III-V semiconductor material, and II-VI semiconductor material.

16. The method of claim 1, further comprising:
selecting at least one of the first semiconductor layer and the at least one additional semiconductor layer to comprise gallium nitride (GaN).

17. The method of claim 16, wherein selecting the at least one of the first semiconductor layer and the at least one additional semiconductor layer to comprise gallium nitride (GaN) comprises selecting the at least one additional semiconductor layer to comprise gallium nitride (GaN).

18. The method of claim 17, further comprising selecting the first semiconductor layer to comprise silicon.

19. The method of claim 17, further comprising selecting each of the first semiconductor layer and the at least one additional semiconductor layer to comprise gallium nitride (GaN).

20. The method of claim 1, further comprising:
selecting at least one of the first semiconductor layer and the at least one additional semiconductor layer to comprise silicon (Si); and
wherein the composite substrate layer comprises silicon oxide ($SiO_2$) and aluminum oxide ($Al_2O_3$).

21. The method of claim 20, wherein selecting the at least one of the first semiconductor layer and the at least one additional semiconductor layer to comprise silicon (Si) comprises selecting the at least one additional semiconductor layer to comprise silicon (Si).

22. The method of claim 20, wherein selecting the at least one of the first semiconductor layer and the at least one additional semiconductor layer to comprise silicon (Si) comprises selecting each of the first semiconductor layer and the at least one additional semiconductor layer to comprise silicon (Si).

23. The method of claim 20, wherein the composite substrate layer comprises about seventy-five percent by volume silicon oxide ($SiO_2$) and about twenty-five percent by volume aluminum oxide ($Al_2O_3$).

24. The method of claim 1, further comprising:
selecting at least one of the first semiconductor layer and the at least one additional semiconductor layer to comprise silicon carbide (SIC); and
wherein the composite substrate layer comprises silicon oxide ($SiO_2$) and aluminum oxide ($Al_2O_3$).

25. The method of claim 24, wherein selecting the at least one of the first semiconductor layer and the at least one additional semiconductor layer to comprise silicon carbide (SiC) comprises selecting each of the first semiconductor layer and the at least one additional semiconductor layer to comprise silicon carbide (SiC).

26. The method of claim 25, wherein the composite substrate layer comprises about forty-nine percent by volume silicon oxide ($SiO_2$) and about fifty-one percent by volume aluminum oxide ($Al_2O_3$).

27. The method of claim 1, wherein the entire composite substrate layer is formed by plasma spray process.

* * * * *